United States Patent [19]

Nagano

[11] Patent Number: 4,471,241

[45] Date of Patent: Sep. 11, 1984

[54] SEMICONDUCTOR INTEGRATED CIRCUIT FOR INTERFACING I²L WITH HIGH-POWERED CIRCUITRY

[75] Inventor: Katsumi Nagano, Hiratsuka, Japan

[73] Assignee: Tokyo Shibaura Denki Kabushiki Kaisha, Japan

[21] Appl. No.: 298,742

[22] Filed: Sep. 2, 1981

[30] Foreign Application Priority Data

Sep. 30, 1980 [JP] Japan .................................. 55-136581

[51] Int. Cl.³ .................. H03K 19/091; H03K 19/092
[52] U.S. Cl. ...................................... 307/475; 307/477
[58] Field of Search ............... 307/475, 477, 454, 459, 307/270, 264, 445

[56] References Cited

U.S. PATENT DOCUMENTS

| | | | |
|---|---|---|---|
| 3,610,949 | 10/1971 | Armgarth | 307/454 |
| 3,798,471 | 3/1974 | Williams et al. | 307/255 |
| 4,100,431 | 7/1978 | Stipanuk | 307/475 |
| 4,158,146 | 6/1979 | Smeulers et al. | 307/270 |
| 4,256,984 | 3/1981 | Kojima | 307/475 |
| 4,358,689 | 11/1982 | Jarrett et al. | 307/475 |
| 4,366,397 | 12/1982 | Kitamura et al. | 307/475 |
| 4,390,802 | 6/1983 | Woltz | 307/475 |

OTHER PUBLICATIONS

Lsaelius, "Simple Circuit Interfaces TTL to CMOS with Single 12-V Supply," Electronic Design 25, 12/6/76, p. 313.

Petrie et al., "Stacked I²L Structures", IEEE Journal of Solid State Circuits, vol. SC-15, No. 2, Apr. 1980.

Jenkins, "Interface Circuits Drive High-Level Switches from Low-Level Inputs", Electronic Engineering, May 1971, pp. 45-49.

Japanese Patent Disclosure (Kokai), No. 54-158157, R. Martin; Dec. 13, 1979, Texas Instruments Inc.

Primary Examiner—John S. Heyman
Assistant Examiner—Timothy P. Callahan
Attorney, Agent, or Firm—Finnegan, Henderson, Farabow, Garrett & Dunner

[57] ABSTRACT

A semiconductor integrated circuit comprising an integrated injection logic circuit, a peripheral circuit driven by a high-voltage power source, and an interface circuit disposed between the integrated injection logic circuit and the peripheral circuit.

The interface circuit is connected with a reference power source. At the output terminal of the integrated injection logic circuit appears such voltage that the collector-emitter voltage of an output transistor of the integrated injection logic circuit is lower than the collector-emitter breakdown voltage (base open) of the output transistor. Further, the interface circuit has a withstanding voltage higher than the collector-emitter breakdown voltage of the output transistor of the integrated injection logic circuit.

8 Claims, 10 Drawing Figures

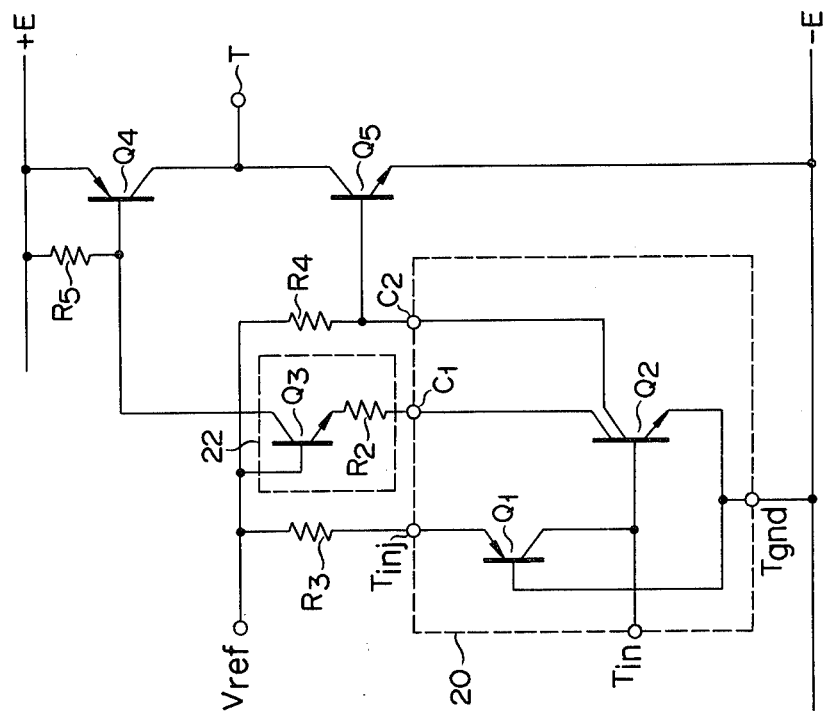
F I G. 5
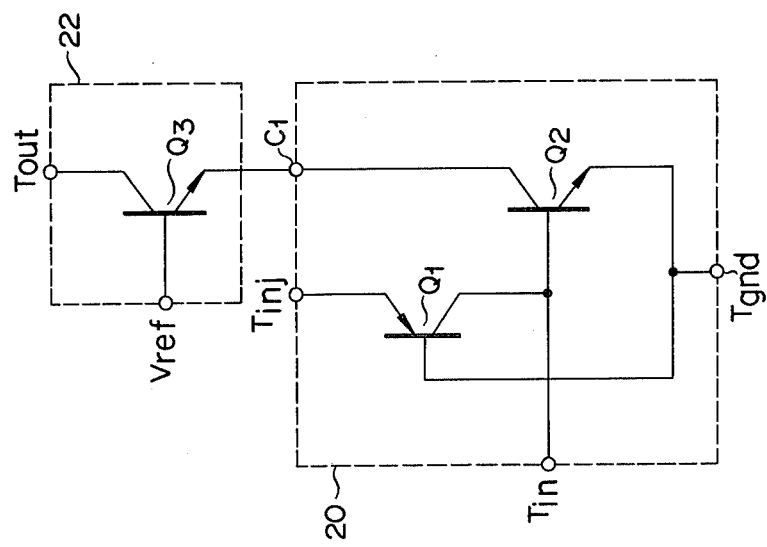
F I G. 3

F I G. 9
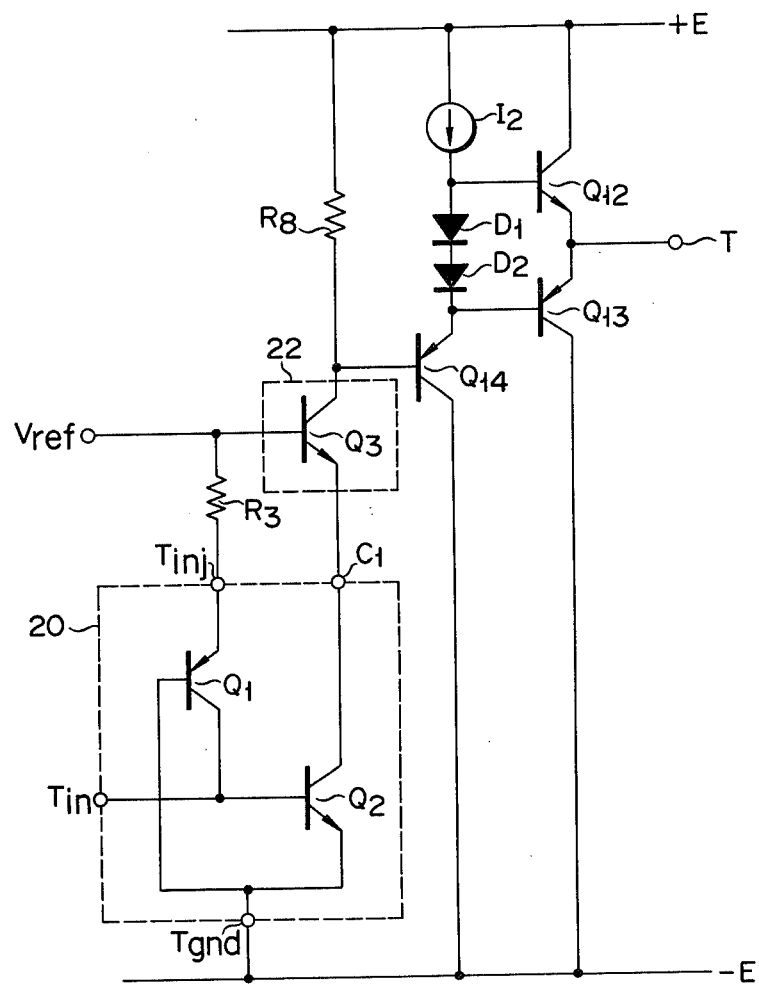

SEMICONDUCTOR INTEGRATED CIRCUIT FOR INTERFACING I²L WITH HIGH-POWERED CIRCUITRY

BACKGROUND OF THE INVENTION

This invention relates to a semiconductor integrated circuit having an interface circuit which connects an integrated injection logic (I²L) circuit with a peripheral circuit driven by a high-voltage power source.

In general, an I²L circuit is so designed that the collector-emitter breakdown voltage (base open) (hereinafter referred to as "output withstanding voltage") $BV_{CEO}$ of its output transistor is limited to increase the current amplification factor $\beta$ of the transistor. FIG. 1 shows an example of the relationship between the current amplification factor $\beta$ and output withstanding voltage $BV_{CEO}$ of the output transistor (transistor Q2 of FIG. 2 mentioned later) of the I²L circuit. In FIG. 1, oblique lines represent the range of variations. For example, $BV_{CEO}$ is approximately 10 V if we have $\beta=10$; approximately 2 V if $\beta=100$. A conventional I²L circuit is so designed that the output withstanding voltage $BV_{CEO}$ is 2 V and below. In this case, it is impossible to obtain an output signal with a great logical amplitude from the I²L circuit.

SUMMARY OF THE INVENTION

The object of this invention is to provide a semiconductor integrated circuit capable of connecting an I²L circuit and a peripheral circuit driven by a high-voltage power source, and producing an output signal with a great logical amplitude.

In order to attain the above object, a semi-conductor integrated circuit of this invention is so constructed that an I²L circuit and a peripheral circuit driven by a high-voltage power source are connected by means of an interface circuit. The interface circuit is connected with a reference power source and supplies the output terminal of the I²L circuit with such potential that the collector-emitter voltage of an output transistor of the I²L circuit is lower than the collector-emitter breakdown voltage (base open) of the output transistor. Also, the interface circuit has a withstanding voltage higher than the collector-emitter breakdown voltage of the output transistor of the I²L circuit.

The above-mentioned construction facilitates the production of an output signal with a logical amplitude greater than that of an output signal produced by the I²L circuit.

Further, it is possible to connect the I²L circuit with the peripheral circuit, such as a TTL circuit, which is driven by a power source supplying higher voltage than the power source for the I²L circuit does. Accordingly, the I²L circuit will be able to enjoy wider application.

Even though the output withstanding voltage (i.e., collector-emitter beakdown voltage, base open) of the I²L circuit is lowered, moreover, the interface circuit of the aforesaid construction can protect the I²L circuit. Thus, the I²L circuit can be miniaturized.

BRIEF DESCRIPTION OF THE DRAWINGS

Other objects and advantages of the invention will become apparent from the following detailed description when taken in conjunction with the accompanying drawings, in which:

FIG. 3 is a circuit diagram showing an embodiment of the I²L circuit and interface circuit of the invention;

FIGS. 5 to 10 are circuit diagrams showing several embodiments of the semiconductor integrated circuit of the invention consisting of an I²L circuit, an interface circuit, and a peripheral circuit.

DETAILED DESCRIPTION OF THE PREFERRED EMBODIMENTS

Figure 1:
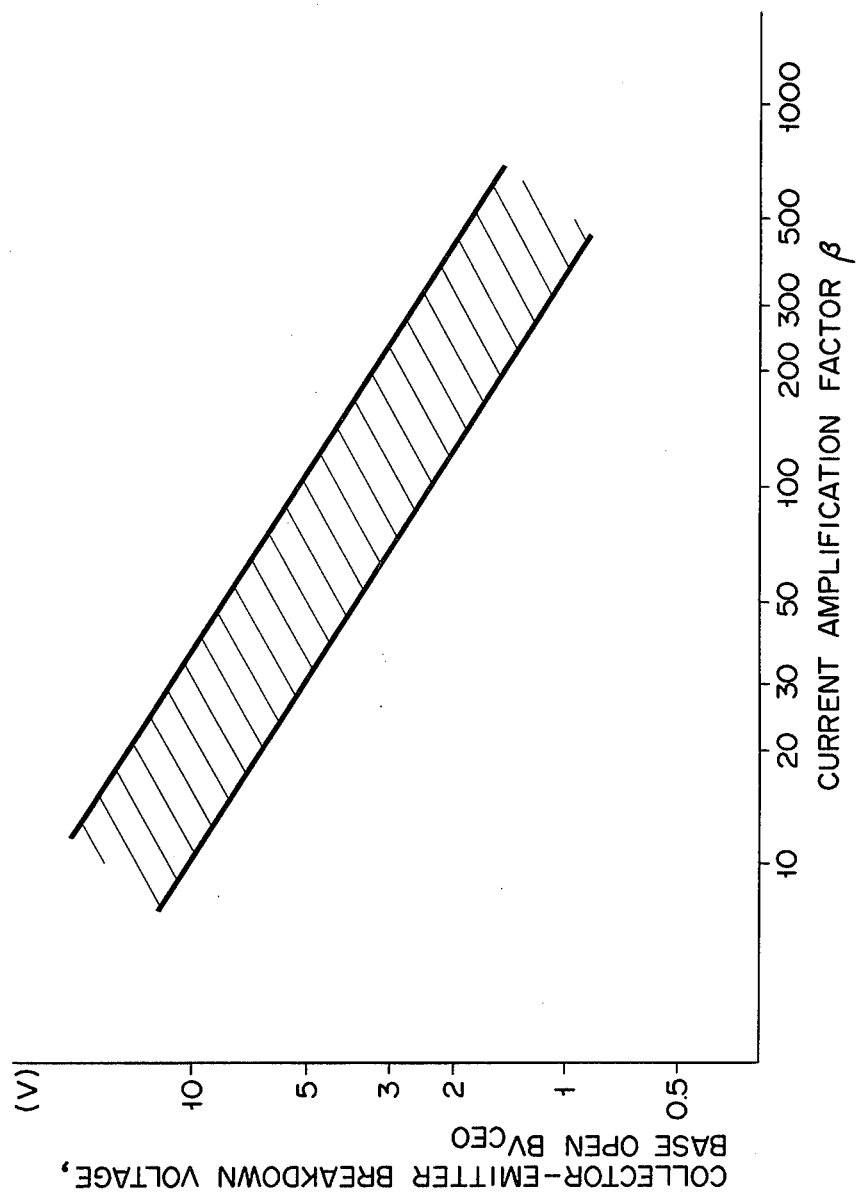
FIG. 1 is a graph showing the relationship between the current amplification factor $\beta$ and collector-emitter breakdown voltage (base open) $BV_{CEO}$ of an output transistor of an I²L circuit.
Figure 2:
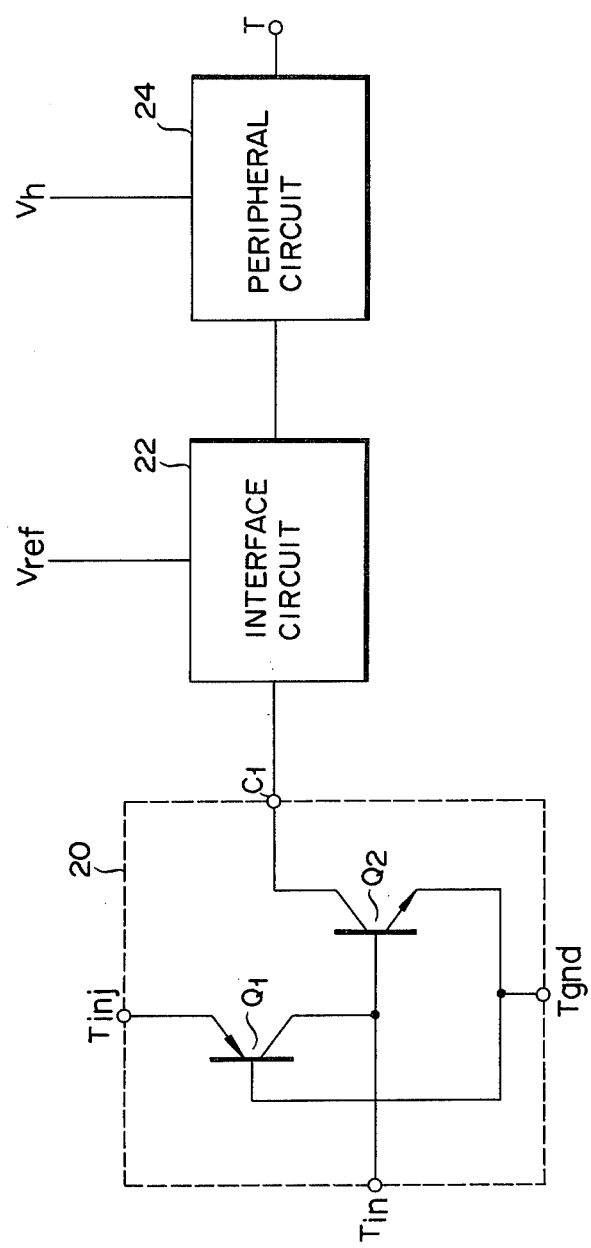
FIG. 2 is a block diagram of a semiconductor integrated circuit according to this invention.

FIG. 2 shows an arrangement of a semiconductor integrated circuit according to this invention, in which an I²L circuit 20 is formed of a PNP transistor Q1 and an NPN transistor Q2. The collector of the transistor Q1 and the base of the transistor Q2 are connected with an input terminal Tin to which input signals from other circuits are applied. The emitter and base of the transistor Q1 are connected with a current injection terminal Tinj and a ground terminal Tgnd, respectively. Further, the emitter and collector of the transistor Q2 are connected with the ground terminal Tgnd and an output terminal C1 of the I²L circuit 20, respectively. Basically, the logical operation of the I²L circuit 20 is an inverter operation to develop at the output terminal C1 a voltage amplitude opposite to the voltage amplitude at the input terminal Tin. When the input signal of the I²L circuit 20 is at high level "H" (i.e., when the input terminal Tin is open), most of injector current injected into the emitter of the transistor Q1 flows through the collector of the transistor Q1 into the base of the transistor Q2, so that the transistor Q2 is turned on, and a signal at low level "L" appears at the output terminal C1. When a signal at low level "L" is applied to the input terminal Tin, on the other hand, the injector current injected into the emitter of the transistor Q1 flows through the collector of the transistor Q1 to the input terminal Tin, and the level of the base voltage of the transistor Q2 becomes "L". Accordingly, the transistor Q2 is turned off, so that a signal at "H" level appears at the output terminal C1.

The logical operation of the I²L circuit 20 is performed in the aforementioned manner. Meanwhile, the collector-emitter breakdown voltage (base open) (output withstanding voltage) $BV_{CEO}$ of the output transistor Q2 in the commonly used I²L circuit 20 is approximately 2 V, as mentioned before. In this case, it is impossible to obtain an output signal with a great logical amplitude at the output terminal C1. Therefore, the semiconductor integrated circuit of this invention is provided with an interface circuit 22 to solve a problem that the logical amplitude cannot be increased due to a restriction on the output withstanding voltage $BV_{CEO}$.

The interface circuit 22 is connected with a reference power source Vref. Based on the reference power source Vref, the interface circuit 22 supplies the output terminal C1 of the I²L circuit 20 with such potential that the collector-emitter voltage of the output transistor Q2 of the I²L circuit 20 is lower than the output withstanding voltage $BV_{CEO}$ of the output transistor Q2. Further, the output terminal of the interface circuit 22 is connected with a peripheral circuit 24. The interface circuit 22 is so designed that the withstanding voltage between its output and input terminals is higher than the output withstanding voltage $BV_{CEO}$ of the output transistor Q2. The peripheral circuit 24 connected with the output terminal of the interface circuit 22 is driven by a high-voltage power source Vh to produce at its output terminal T an output signal with a logical amplitude greater than that of a signal appearing at the output terminal C1 of the I²L circuit 20.

FIG. 3 shows an embodiment of the interface circuit 22. The interface circuit 22 is formed of an NPN transistor Q3. The base of the transistor Q3 is connected with the reference voltage source Vref which produces constant voltage. In the I²L circuit 20, injector current is supplied by using a voltage source of 2 $V_{BE}$ (approx. 1.4 V) which is twice the base-emitter voltage of the transistors Q1 and Q2. This voltage source can be used as the reference voltage source Vref which is connected with the base of the transistor Q3. The emitter and collector of the transistor Q3 are connected with the output terminal C1 of the I²L circuit 20 and the output terminal Tout of the interface circuit, respectively.

When an "H"-level signal is applied to the input terminal Tin of the I²L circuit 20, the transistor Q2 is turned on as mentioned before, so that collector current flows through the transistor Q2. In this case, the emitter voltage of the transistor Q3 may be given by Vref-$V_{BE}$. If the reference voltage Vref is twice as high as the base-emitter voltage $V_{BE}$ of the transistor Q2, then the emitter voltage of the transistor Q3 will be kept constant at approximately 0.7 V. Accordingly, the voltage supplied to the output terminal C1 of the I²L circuit 20 is kept constant at approximately 0.7 V.

When an "L"-level signal is applied to the input terminal Tin, on the other hand, the transistor Q2 is turned off as mentioned before, so that the collector current of the transistor Q2 is reduced to zero, and output current from the transistor Q3 becomes zero. Since the emitter current of the transistor Q3 is zero at this time, the emitter voltage of the transistor Q3 can be deemed equal to the reference voltage Vref. Further, the collector voltage of the transistor Q2 reaches the reference voltage Vref. As a result, the voltage applied to the output terminal C1 of the I²L circuit 20 becomes Vref=$2V_{BE}$=1.4 V. The use of the transistor Q3 lowers the voltage applied to the collector of the transistor Q2 of the I²L circuit 20 below the reference voltage Vref. Since the logical signal of the I²L circuit 20 is converted into a collector current signal of the transistor Q3, the peripheral circuit 24 of FIG. 2 can be driven by connecting it with the output terminal Tout which is connected with the collector of the transistor Q3. Being not of I²L configuration, the NPN transistor Q3 used in the interface circuit 22 can be so designed that its output withstanding voltage $BV_{CEO}$ is approximately 30 V. It is therefore possible to obtain a logical signal with an amplitude greater than that of the signal which appears at the output terminal C1 of the I²L circuit 20.

Figure 4:
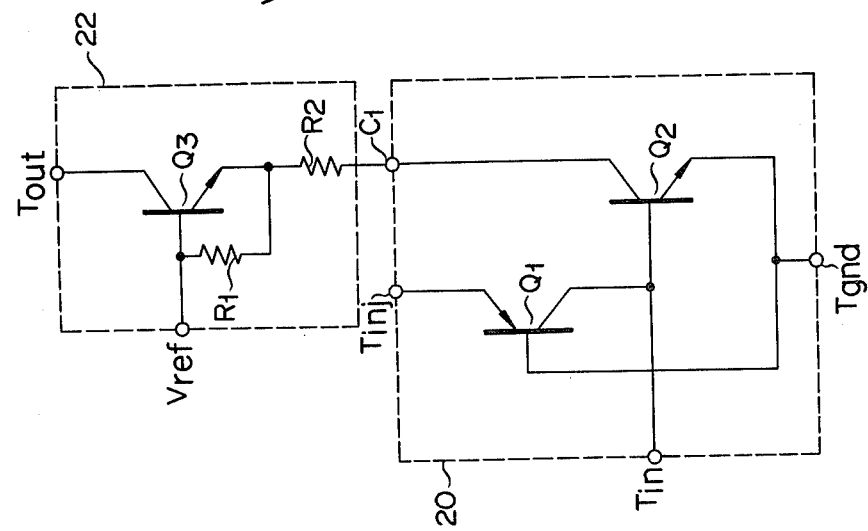
FIG. 4 is a circuit diagram showing another embodiment of the I²L circuit and interface circuit of the invention.

FIG. 4 shows another example of the interface circuit 22. In this interface circuit 22, a resistor R1 for absorbing leakage current is connected between the base and emitter of the transistor Q3. The resistor R1 prevents the transistor Q3 from being caused to operate wrongly by a leakage current from the collector of the transistor Q2 of the I²L circuit which is liable to develop when the transistor Q2 is cut off. Since the leakage current flowing to the emitter side of the transistor Q3 flows through the resistor R1 into the reference voltage source Vref, the transistor Q3 will be kept cut off if a voltage drop caused by the leakage current flowing through the resistor R1 is small. Thus, the leakage current will never appear at the output terminal Tout. Further, connected between the output terminal C1 of the I²L circuit and the emitter of the transistor Q3 is a resistor R2 for limiting an output current which is generated in case of the transistor Q2 being on. In this case, therefore, the output current of the transistor Q3 of the interface circuit 22 may be given by 1/R2(Vref-$V_{BE}$-$V_{CEsat}$). Here $V_{CEsat}$ is the collector-emitter saturation voltage of the transistor Q2, and $V_{BE}$ is the base-emitter voltage of the transistor Q3. The circuit shown in FIG. 4 apparently performs the same logical operation as the circuit of the aforesaid embodiment does. Thus, a logical signal with an amplitude greater than that of the signal appearing at the output terminal C1 of the I²L circuit 20 is obtained at the output terminal Tout of the interface circuit 22.

Referring now to the drawings of FIGS. 5 to 9, there will be described several embodiments of the semi-conductor integrated circuit of this invention using the above-mentioned interface circuit. The circuit shown in FIG. 5 is a non-inverting buffer circuit which drives a PNP output transistor Q4 in accordance with the output signal of the NPN transistor Q3 forming the interface circuit 22. An output transistor Q2 of an I²L circuit 20 has multi-collectors. A first output terminal C1 connected with the first collector of the transistor Q2 is connected with the emitter of the transistor Q3 through the resistor R2 of e.g. 5 kΩ. The injection terminal Tinj of the I²L circuit 20 is connected with the reference power source Vref through an injector resistor R3. A second output terminal C2 connected with the second collector of the transistor Q2 is connected with the base of an NPN output transistor Q5, and connected also with the reference power source Vref through a resistor R4 of e.g. 5 kΩ. The collector and base of the transistor Q3 of the interface circuit 22 are connected with the base of the output transistor Q4 and the reference power source Vref, respectively. The output transistor Q4 has its base connected with a positive power source +E through a resistor R5 of e.g. 33 kΩ, its emitter with the positive power source +E, and its collector with the collector of the output transistor Q5. The junction of the pair of complementary transistors Q4 and Q5 is connected with an output terminal T. Moreover, the emitter of the output transistor Q5 and the ground terminal Tgnd of the I²L circuit 20 are connected with a negative power source −E.

When an "H"-level signal is applied to the input terminal Tin of the I²L circuit 20, the transistor Q2 is turned on, so that the output transistor Q5 is turned off. Since the transistor Q3 is on at this time, collector current flows through the transistor Q3. Accordingly, the output transistor Q4 is turned on, and an "H"-level output is delivered from the output terminal T. When an "L"-level signal is applied to the input terminal Tin, on the other hand, the transistor Q2 is cut off, so that the output transistor Q5 is turned on. Thus, an "L"-level output is delivered from the output terminal T. In this case, no collector current flows through the transistor Q3, so that the output transistor Q4 is cut off. Since the output transistor Q5 tends to absorb current, and the output transistor Q4 is capable of letting out current, an output signal with an amplitude greater than the amplitude obtained with use of the prior art circuit can be delivered from the output terminal T of the semiconductor integrated circuit of this invention.

Figure 6:
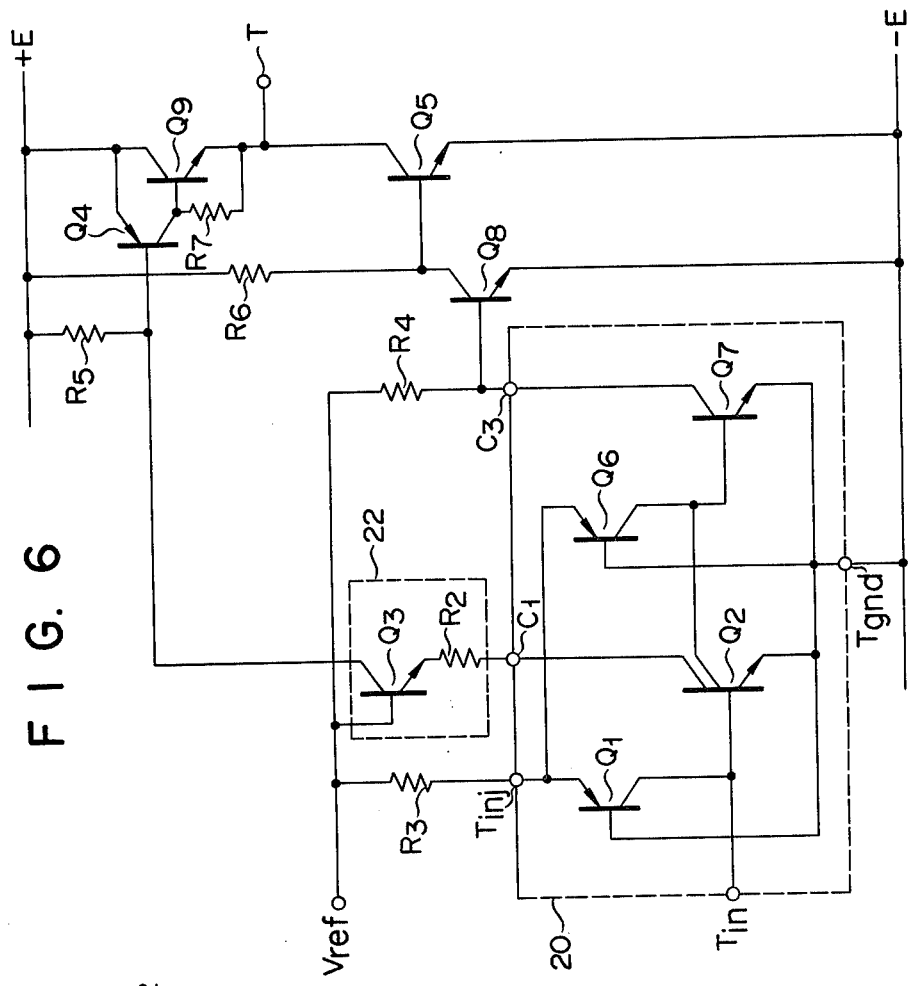

Referring now to FIG. 6, there will be described another embodiment of the semiconductor integrated circuit of the invention. This circuit also is a non-inverting buffer circuit. In this circuit, a driver transistor Q8 is provided ahead of an output transistor Q5 to improve the current absorbing capability of the output transistor Q5. An I²L circuit 20 consists of a first I²L unit circuit formed of a PNP transistor Q1 and a multi-collector NPN transistor Q2, and a second I²L unit circuit formed of a PNP transistor Q6 and an NPN transistor Q7. The first collector of the output transistor Q2 of the first I²L unit circuit is connected with the input terminal of the second I²L unit circuit, i.e., the base of the transistor Q7. At the output terminal C3 of the second I²L unit circuit connected with a second collector terminal appears a signal with a phase opposite to that of a signal appearing at the output terminal C1 of the first I²L unit circuit. The output terminal C3 of the I²L circuit 20 is connected with the base of the driver transistor Q8 and also with the reference power source Vref through the resistor R4 of e.g. 5 kΩ. The collector of the driver transistor Q8 is connected with the base of the output transistor Q5 and also with the positive power source +E through a resistor R6 of e.g. 10 kΩ. The emitter of the driver transistor Q8 is connected with the negative power source −E. As in the case of the aforementioned embodiment, the output terminal C1 of the I²L circuit 20 is connected with the emitter of the NPN transistor Q3 of the interface circuit 22 through the resistor R2 of e.g. 5 kΩ. The transistor Q3 has its base connected with the reference power source Vref, and its collector connected with the positive power source +E through the resistor R5 of e.g. 33 kΩ and also with the base of a PNP transistor Q4. Further, the PNP transistor Q4 and an NPN transistor Q9 are inverted Darlington-connected. In other words, the transistor Q4 has its emitter connected with the collector of the transistor Q9 and the positive power source +E, and its collector connected with the base of the transistor Q9. Moreover, the collector of the transistor Q4 is connected with the emitter of the transistor Q9 through a resistor R7 of e.g. 33 kΩ and also with the output terminal T and the collector of the transistor Q5. The injection terminal Tinj of the I²L circuit 20 is connected with the reference power source Vref through the resistor R3. The logical operation of this embodiment is substantially the same as that of the embodiment of FIG. 5.

Figure 7:
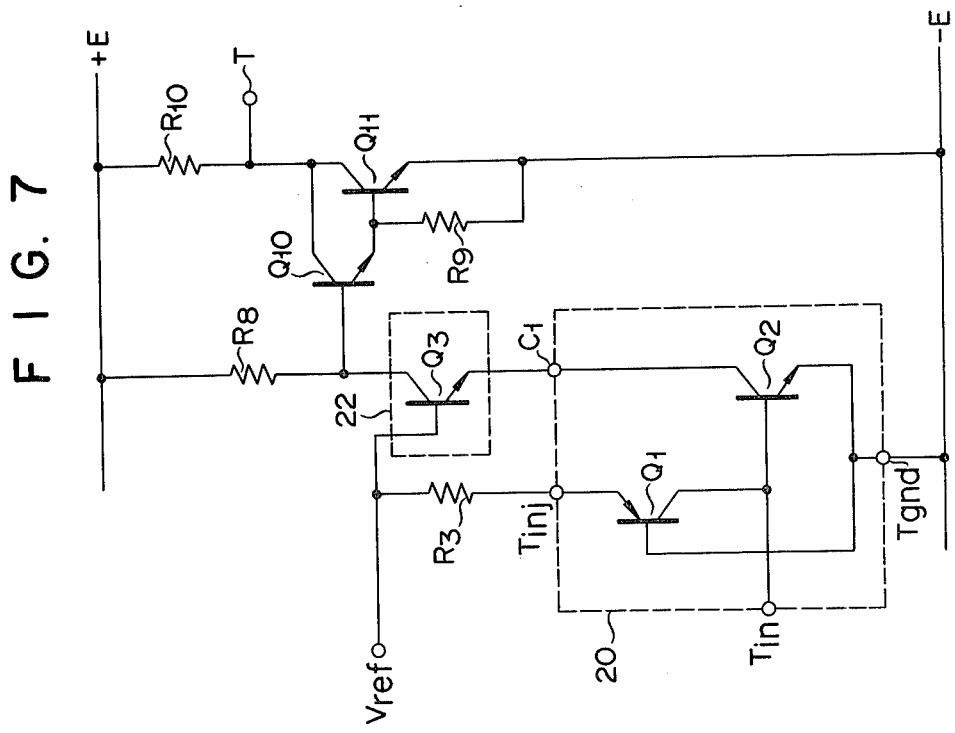

Referring now to FIG. 7, there will be described still another embodiment of the semiconductor integrated circuit of the invention. This circuit is a non-inverting buffer circuit which drives Darlington-connected NPN transistors Q10 and Q11 by means of the fundamental circuit of FIG. 3. The output terminal C1 of the I²L circuit 20 is connected with the emitter of the NPN transistor Q3 forming the interface circuit 22. The transistor Q3 has its base connected with the reference power source Vref, and its collector connected with the positive power source +E through a resistor R8 of e.g. 100 kΩ and also with the base of the transistor Q10. The collectors of the transistors Q10 and Q11 are connected with the output terminal T and also with the positive power source +E through a resistor R10 of e.g. 1 kΩ. The emitter of the transistor Q10 is connected with the base of the transistor Q11 and the negative power source −E through a resistor R9 of e.g. 33 kΩ. The injection terminal Tinj of the I²L circuit 20 is connected with the reference power source Vref through the resistor R3, and the ground terminal Tgnd of the I²L circuit 20 is connected with the negative power source −E. When an "H"-level input signal is applied to the input terminal Tin, the transistor Q2 is turned on to allow current to flow through the collector of the transistor Q3. As a result, the collector voltage of the transistor Q3 is lowered to turn off the Darlington-connected transistors Q10 and Q11. Thus, an "H"-level signal appears at the output terminal T. When an "L"-level signal is applied to the input terminal Tin, on the other hand, the transistor Q2 is turned off. Accordingly, the collector potential of the transistor Q3 is increased to turn on the output transistors Q10 and Q11. As a result, an "L"-level signal appears at the output terminal T.

Figure 8:
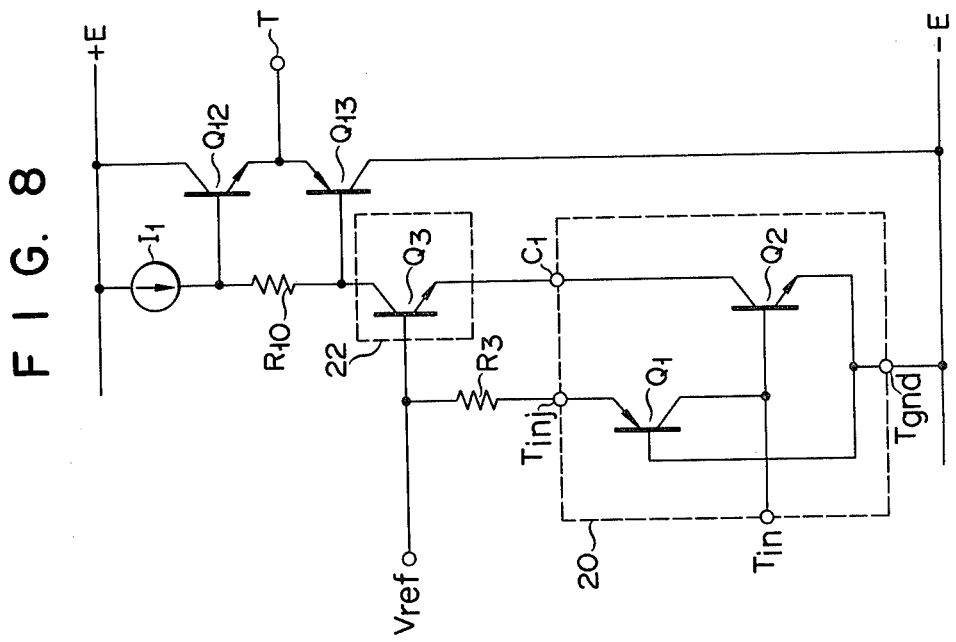

Referring now to FIG. 8, there will be described a further embodiment of the semiconductor integrated circuit of the invention. This circuit is an inverted buffer circuit which drives a pair of emitter-follower-connected, complementary output transistors Q12 and Q13 by means of the NPN transistor Q3 forming the interface circuit 22. The output terminal C1 of the I²L circuit 20 is connected with the emitter of the transistor Q3. The transistor Q3 has its base connected with the reference power source Vref, and its collector connected with the base of the transistor Q13 and also with the base of the transistor Q12 and one end of a constant-current source I1 of e.g. 100 μA through a resistor R10 of e.g. 10 kΩ. The other end of the constant-current source I1 is connected with the positive power source +E. The transistor Q12 has its collector connected with the positive power source +E, and its emitter connected with the emitter of the transistor Q13 and the output terminal T. The collector of the transistor Q13 and the ground terminal Tgnd of the I²L circuit 20 are connected with the negative power source −E. Further, the injection terminal Tinj of the I²L circuit 20 is connected with the reference power source Vref through the resistor R3. When an "H"-level input signal is applied to the input terminal Tin, the transistor Q2 is turned on to cause collector current to flow through the transistor Q3. As a result, the base potential of the output transistor Q13 is lowered to turn on the output transistor Q13. Thus, an "L"-level output signal appears at the output terminal T. When an "L"-level signal is applied to the input terminal Tin, on the other hand, the transistor Q2 is cut off, so that no collector current flows through the transistor Q3. Accordingly, the base potential of the output transistor Q12 is increased to turn on the transistor Q12, so that an "H"-level signal appears at the output terminal T.

Referring now to FIG. 9, there will be described a further embodiment of the semiconductor integrated circuit of the invention. This circuit is an inverted buffer circuit which is additionally provided with a driver transistor Q14 connected with the output transistor Q13 to increase the output current capacity of the inverted buffer circuit of FIG. 8. The output terminal C1 of the I²L circuit 20 formed of the PNP transistor Q1 and NPN transistor Q2 is connected with the emitter of the NPN transistor Q3 forming the interface circuit 22. The transistor Q3 has its base connected with the reference power source Vref, and its collector connected with the positive power source +E through a resistor R8 of e.g. 100 kΩ and also with the base of the driver transistor Q14. The driver transistor Q14 has its collector connected with the negative power source −E, and its emitter connected with the base of the output transistor Q13 and the cathode of a diode D2 which is connected in series with a diode D1. The anode of the diode D1 is connected with the base of the transistor Q12 and also with the positive power source +E through a constant-current source I2 of e.g. 1 mA. The output transistors Q12 and Q13 are emitter-follower-connected. In other words, the output transistor Q12 has its collector connected with the positive power source +E and its emitter connected with the emitter of the output transistor Q13. The collector of the output transistor Q13 is connected with the negative power source −E. The ground terminal Tgnd of the I²L circuit 20 is connected with the negative power source −E, and the injection terminal Tinj is connected with the reference power source Vref through the resistor R3. This circuit performs substantially the same logical operation as the circuit shown in FIG. 8 does.

The above-mentioned semiconductor integrated circuits according to the embodiments shown in FIGS. 5 to 9 produce an output signal with a logical amplitude greater than that of an output signal delivered from an I²L circuit. By the use of the interface circuit, moreover, the I²L circuit can be connected with a peripheral circuit which is driven by a high-voltage power source supplying higher voltage than the driving power source for the I²L circuit does. For example, the I²L circuit can be used in concurrence with a TTL (transistor-transistor logic) circuit.

Figure 10:
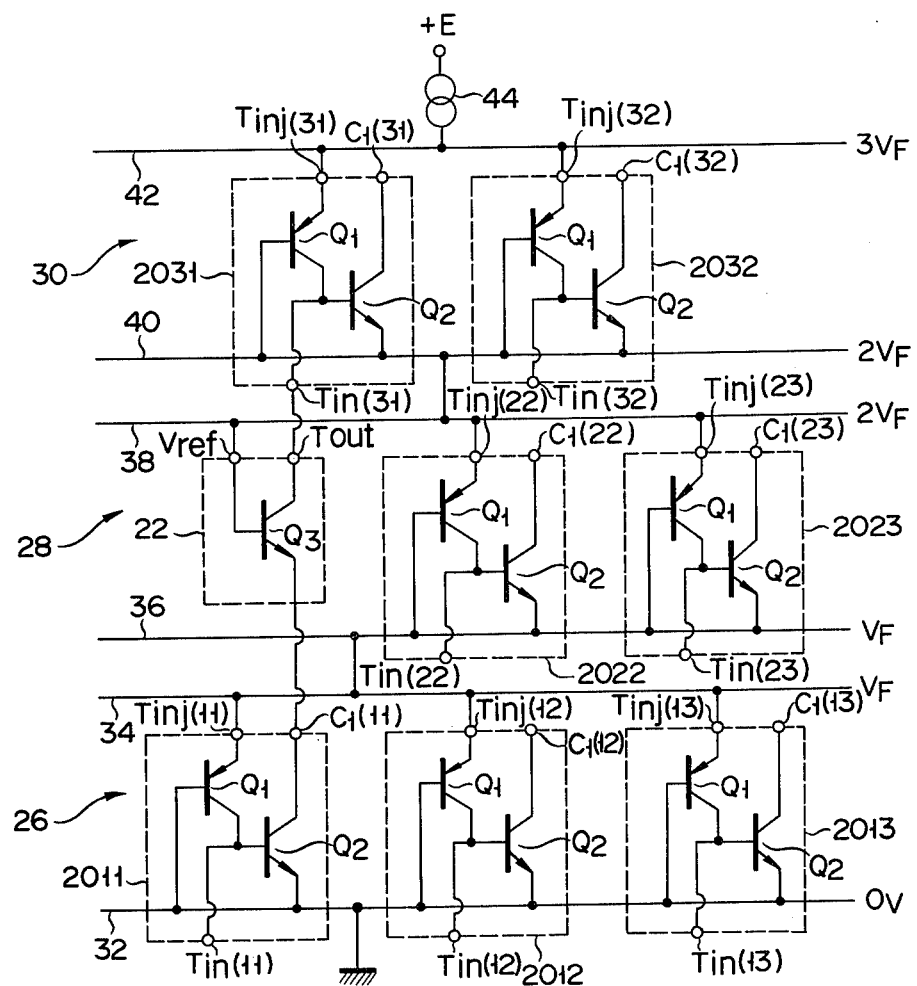

Referring now to FIG. 10, there will be described an additional embodiment of the semiconductor integrated circuit of the invention. This circuit is a stack I²L circuit which is composed of a first-layer circuit 26 including a plurality of I²L unit circuits 201₁ to 201₃, a second-layer circuit 28 including a plurality of I²L unit circuits 202₂ and 202₃ and an interface circuit 22, and a third-layer circuit 30 including a plurality of I²L unit circuits 203₁ and 203₂. The respective ground terminals, as well as the respective injection terminals Tinj(n), of these I²L unit circuits are connected in common. A common ground terminal line 32 of the first-layer circuit 26 are grounded and a common injection terminal line 34 of the first-layer circuit 26 are connected with a common ground terminal line 36 of the second-layer circuit 28. A common injection terminal line 38 of the second-layer circuit 28 is connected with a common ground terminal line 40 of the third-layer circuit 30, while a common injection terminal line 42 of the third-layer circuit 30 is connected with an injection current source 44 which is connected with the positive power source +E. If the base-emitter voltage of the respective output transistors Q2 of the I²L unit circuits 201₁ to 203₂ obtained when the output transistors Q2 are on is $V_F$, then the potential of the common ground terminal line 36 of the second-layer circuit 28 is $V_F$, the potential of the common ground terminal line 40 of the third-layer circuit 30 is $2V_F$, and the potential of the common injection terminal line 42 of the third-layer circuit 30 is $3V_F$.

Meanwhile, the output terminal C1(11) of the I²L unit circuit 201₁ forming the first-layer circuit 26, in this embodiment, is connected with the emitter of the NPN transistor Q3 forming the interface circuit 22 which is constructed in the second-layer circuit 28. Moreover, the transistor Q3 has its base connected with the common injection terminal line 38 of the second-layer circuit 28 with a potential of $2V_F$, and its collector connected with the input terminal Tin(31) of the I²L unit circuit 203₁ forming the third-layer circuit 30. In the prior art circuit, the output withstanding voltage $BV_{CEO}$ of the output transistor Q2 of the I²L unit circuit 201₁ forming the first-layer circuit 26 is too low to connect the output terminal C1(11) of the I²L unit circuit 201₁ directly with the input terminal Tin(31) of the third-layer circuit 30 in order to drive the third-layer circuit 30. By the use of the aforementioned interface circuit 22, however, the I²L unit circuit 203₁ of the third-layer circuit 30 can be driven by the I²L unit circuit 201₁ of the first-layer circuit 26 without hindrance.

Although the I²L circuit of FIG. 10 has a three-layer stack configuration, an I²L circuit of a higher layer or stratum can be driven in accordance with a signal from an I²L circuit of a lower layer despite an increased number of layers, if the voltage between the common ground terminal of the higher layer circuit and the common injection terminal of the lower layer circuit is lower than the output withstanding voltage $BV_{CEO}$ of the transistor Q3 which is not of I²L construction.

What is claimed is:

1. A semiconductor integrated circuit comprising:
    an integrated injection logic (I²L) circuit having an output transistor with an injector and multi-collectors, and first and second output terminals connected to the multi-collectors;
    a peripheral circuit having first and second complementary transistors connected in series along an emitter-collector path, said first and second transistors being connected, respectively, to first and second high-voltage power sources of opposite polarities, with a base of said first transistor being connected to the first output terminal; and
    an interface circuit disposed between said second output terminal and a base of said second transistor, said interface circuit being connected with a reference power source for supplying the second output terminal of said I²L circuit with such a voltage that the collector-emitter voltage of said output transistor of said I²L circuit is lower than the collector-emitter breakdown voltage of said output transistor of said I²L circuit, said first and second transistors being driven by signals from said first and second output terminals, respectively, to produce an output signal at a node on said emitter-collector path having an amplitude greater than that of the signals on said first and second output terminals.

2. A semiconductor integrated circuit according to claim 1, wherein said interface circuit is an NPN transistor having an emitter connected with the second output terminal of said I²L circuit, a collector connected with said base of said second transistor, and a base connected with said reference power source.

3. A semiconductor integrated circuit according to claim 1, wherein said interface circuit is an NPN transistor having an emitter connected with the second output terminal of said I²L circuit through a first resistor, a collector connected with said base of said second transistor, and a base connected with said reference power source, said emitter and said base of said NPN transistor being coupled together through a second resistor.

4. A semiconductor integrated circuit according to any one of claims 1 to 3, wherein said reference power source is identical with a power source for supplying the injector of said I²L circuit with injector current.

5. A semiconductor integrated circuit according to claim 1, wherein one of said multi-collectors is connected to the second output terminal through a second I²L circuit, and the output signals of said first and second output terminals are of opposite phase.

6. A semiconductor integrated circuit according to claim 5, wherein said interface circuit is an NPN transistor having an emitter connected with the second output terminal of said I²L circuit, a collector connected with said base of the second transistor, and a base connected with said reference power source.

7. A semiconductor integrated circuit according to claim 5, wherein said interface circuit is an NPN transistor having an emitter connected with the second output terminal of said I²L circuit through a first resistor, a collector connected with said base of the second transistor, and a base connected with said reference power source, said emitter and said base of said NPN transistor being coupled together through a second resistor.

8. A semiconductor integrated circuit according to claim 5, wherein said reference power source is identical with a power source for supplying the injector of said I²L circuit with injector current.

* * * * *